(12) United States Patent
Kondo (10) Patent No.: US 12,253,565 B2
(45) Date of Patent: *Mar. 18, 2025

(54) METHODS AND SYSTEM FOR A BATTERY (71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 553 days.

This patent is subject to a terminal disclaimer.

(21) Appl. No.: 17/649,956

(22) Filed: Feb. 4, 2022

(65) Prior Publication Data
US 2022/0155379 A1 May 19, 2022

Related U.S. Application Data (63) Continuation of application No. 16/670,650, filed on Oct. 31, 2019, now Pat. No. 11,275,119.

(60) Provisional application No. 62/899,832, filed on Sep. 13, 2019.

(51) Int. Cl.
*H02J 7/00* (2006.01)
*G01R 31/36* (2020.01)
*G01R 31/367* (2019.01)
*G01R 31/3835* (2019.01)

(52) U.S. Cl.
CPC ....... *G01R 31/3648* (2013.01); *G01R 31/367* (2019.01); *G01R 31/3835* (2019.01); *H02J 7/0047* (2013.01); *H02J 7/0025* (2020.01); *H02J 7/0048* (2020.01); *H02J 7/0063* (2013.01)

(58) Field of Classification Search
CPC .............. G01R 31/3648; G01R 31/367; G01R 31/3835; G01R 31/3842; G01R 31/374; G01R 31/392; H02J 7/0047; H02J 7/0025; H02J 7/0048; H02J 7/0063
See application file for complete search history.

(56) References Cited

U.S. PATENT DOCUMENTS

| | | | |
|---|---|---|---|
| 5,130,659 A | 7/1992 | Sloan | |
| 5,164,652 A | 11/1992 | Johnson | |
| 5,424,722 A | 6/1995 | Inada | |
| 5,994,878 A | 11/1999 | Ostergaard | |
| 6,317,697 B1 * | 11/2001 | Yoshikawa | G01R 19/16542 320/149 |
| 6,549,014 B1 | 4/2003 | Kutkut | |
| 7,239,146 B2 * | 7/2007 | James | G01R 19/16542 324/426 |
| 11,275,119 B2 * | 3/2022 | Kondo | G01R 31/3648 |
| 2005/0266301 A1 | 12/2005 | Smith | |
| 2011/0115295 A1 | 5/2011 | Moon | |

(Continued)

*Primary Examiner* — Nghia M Doan
(74) *Attorney, Agent, or Firm* — Dickinson Wright PLLC; Jonathan A. Schnayer (57) ABSTRACT

Various embodiments of the present technology may provide methods and system for a battery. The system may provide a fuel gauge circuit configured to select an energy curve from a plurality of energy curves and determine a remaining energy value based on the selected energy curve and a computed remaining capacity of the battery. The fuel gauge circuit controls a current to a load based on the remaining energy value.

9 Claims, 7 Drawing Sheets

(56) References Cited

U.S. PATENT DOCUMENTS

2015/0164391 A1\* 6/2015 Hernandez-Rosas ........................ H04W 52/0277
  600/365
2016/0172879 A1  6/2016 Valentine
2018/0100898 A1  4/2018 Benosman \* cited by examiner

METHODS AND SYSTEM FOR A BATTERY

CROSS-REFERENCE TO RELATED APPLICATIONS

This is a continuation of U.S. application Ser. No. 16/670,650 filed Oct. 31, 2019 titled "Methods and System for a Battery" (now U.S. Pat. NUMBER). The '650 Application claimed the benefit of U.S. Provisional Patent Application No. 62/899,832, filed on Sep. 13, 2019. Both the noted applications are incorporated herein by reference as if reproduced in full below.

BACKGROUND OF THE TECHNOLOGY

"Battery capacity" is a measure (typically in ampere-hours) of the charge stored by the battery and is determined by the mass of active material contained in the battery. The remaining battery capacity may provide an indication of "run-time" (i.e., lifespan) of the battery, which reflects the amount of time the battery will continue to provide power before it dies. An accurate estimate of the run-time is desired to provide alerts to a user as to the remaining life of the battery. The remaining battery capacity, however, is not always equal to the remaining energy because the elapsed time and battery current used to compute the remaining capacity may not be the same as the elapsed time used to the compute the remaining energy (which is calculated using an elapsed time, current, and voltage). Therefore, it may be desirable to determine the run-time of the battery based on the remaining energy, in addition to the remaining capacity.

SUMMARY OF THE INVENTION

Various embodiments of the present technology may provide methods and system for a battery. The system may provide a fuel gauge circuit configured to select an energy curve from a plurality of energy curves and determine a remaining energy value based on the selected energy curve and a computed remaining capacity of the battery. The fuel gauge circuit controls a current to a load based on the remaining energy value.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, semiconductor devices, such as transistors and capacitors, and the like, which may carry out a variety of functions. In addition, the present technology may be integrated in any number of electronic systems, such as automotive, aviation, "smart devices," portables, e-cigarettes, and consumer electronics, and the systems described are merely exemplary applications for the technology.

Figure 1:
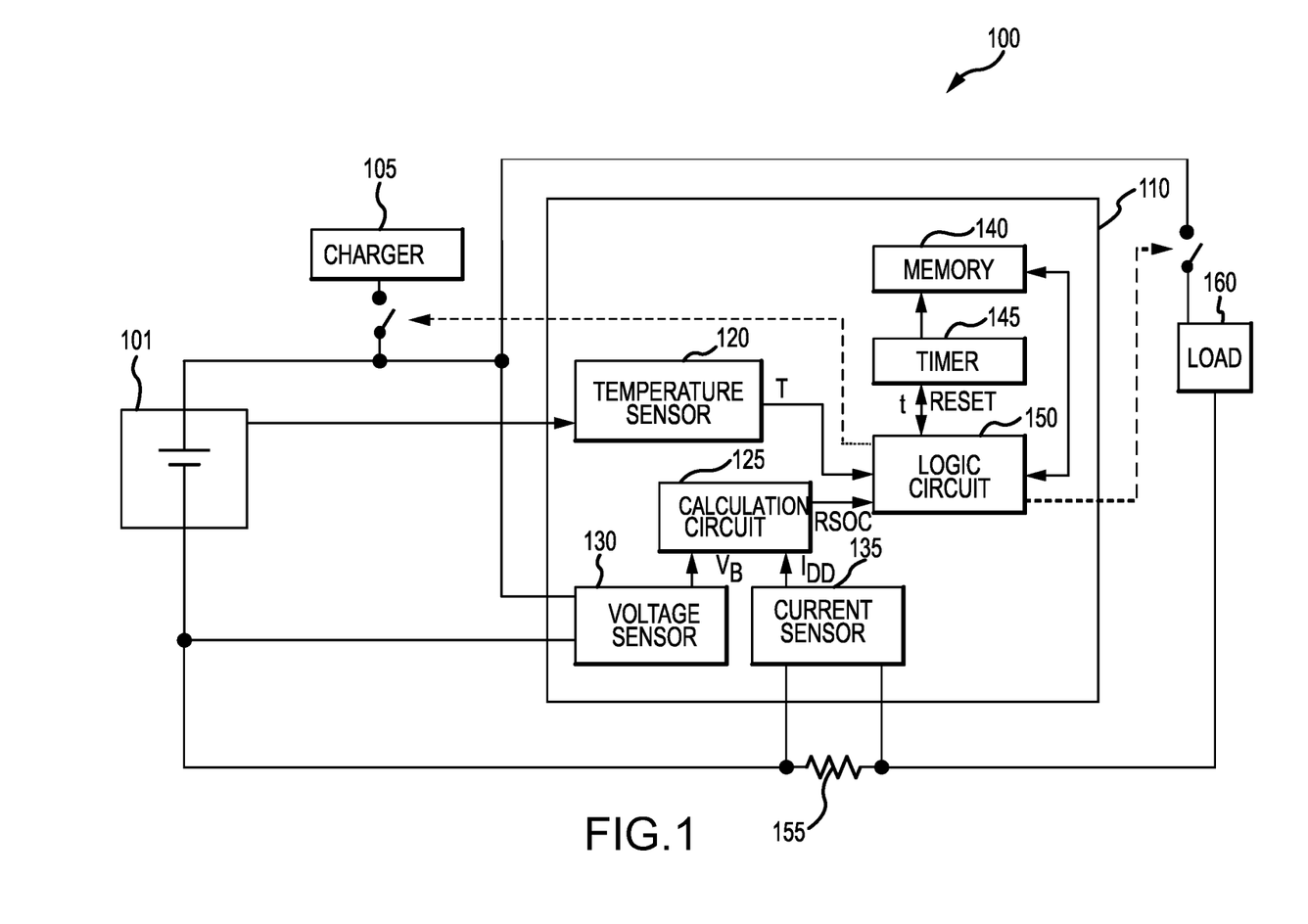
FIG. 1 is a block diagram of a battery system in accordance with an exemplary embodiment of the present technology.

Methods and system for a battery according to various aspects of the present technology may operate in conjunction with any suitable electronic system and/or device, such as "smart devices," wearables, consumer electronics, portable devices, battery-powered vehicles, and the like. Referring to FIG. 1, an exemplary system 100 may be integrated in an electronic device (not shown), such as an e-cigarette, powered by a rechargeable battery 101, such as a lithium ion battery. For example, in various embodiments, the battery 101 may operate in conjunction with a charger 105 to provide power to a load 160, such as a heating coil in the e-cigarette.

The system 100 may further comprise a fuel gauge circuit 110 to manage various battery operations and monitor various battery conditions. For example, the fuel gauge circuit 110 may be configured to measure a voltage $V_B$ of the battery 101, measure a current $I_{DD}$ of the battery 101, compute a remaining capacity (also expressed as a percentage and referred to as the relative state of charge RSOC) of the battery 101, compute a state of health (SOH) of the battery 101, and estimate a lifespan of the battery 101.

In addition, the fuel gauge circuit 110 may be configured to store various battery data. For example, the fuel gauge circuit 110 may store predetermined battery characteristics, such as a plurality of energy curves that describe a relationship between a remaining energy of the battery at different voltage levels as a function of the state of charge (i.e., RSOC) of the battery 101. The fuel gauge circuit 110 may also store predetermined values, such as a predetermined threshold voltage value $V_{TH}$.

In an exemplary embodiment, the fuel gauge circuit 110 may comprise a temperature sensor 120 to measure a temperature T of the battery 101. The temperature sensor 120 may comprise a thermistor (not shown) that generates a signal and an analog-to-digital converter (not shown) to convert the signal to a voltage which corresponds to the temperature T of the battery 101. The temperature sensor 120 may, however, comprise any appropriate sensor or other device or system for generating a signal corresponding to the temperature of the battery 101.

In an exemplary embodiment, the fuel gauge circuit 110 may comprise a voltage sensor 130 to measure the voltage $V_B$ of the battery 101. The voltage sensor 130 may be connected to the battery 101 and may comprise any circuit and/or device suitable for measuring a voltage potential.

In an exemplary embodiment, the fuel gauge circuit 110 may comprise a current sensor 135 to measure the current $I_{DD}$ to/from the battery 101 and the load 160. The current sensor 135 may operate in conjunction with a sense resistor 155, wherein the current senor 135 measures a change in voltage across the sense resistor 155 to determine the current.

In an exemplary embodiment, the fuel gauge circuit 110 may comprise a calculation circuit 125 to compute the remaining capacity RC (measured in ampere-hours) and/or the RSOC (the remaining capacity RC represented as a percentage). The calculation circuit 125 may be connected to the voltage sensor 130 to receive the measured voltage $V_B$ data. The calculation circuit 125 may also be connected to the current sensor 135 to receive the measured current data $I_{DD}$. The calculation circuit 125 may be configured to compute the remaining capacity according to the measured voltage $V_B$ and the measured current. The calculation circuit 125 may compute the remaining capacity of the battery 101 according to conventional "voltage-based" methods and techniques.

Figure 6:
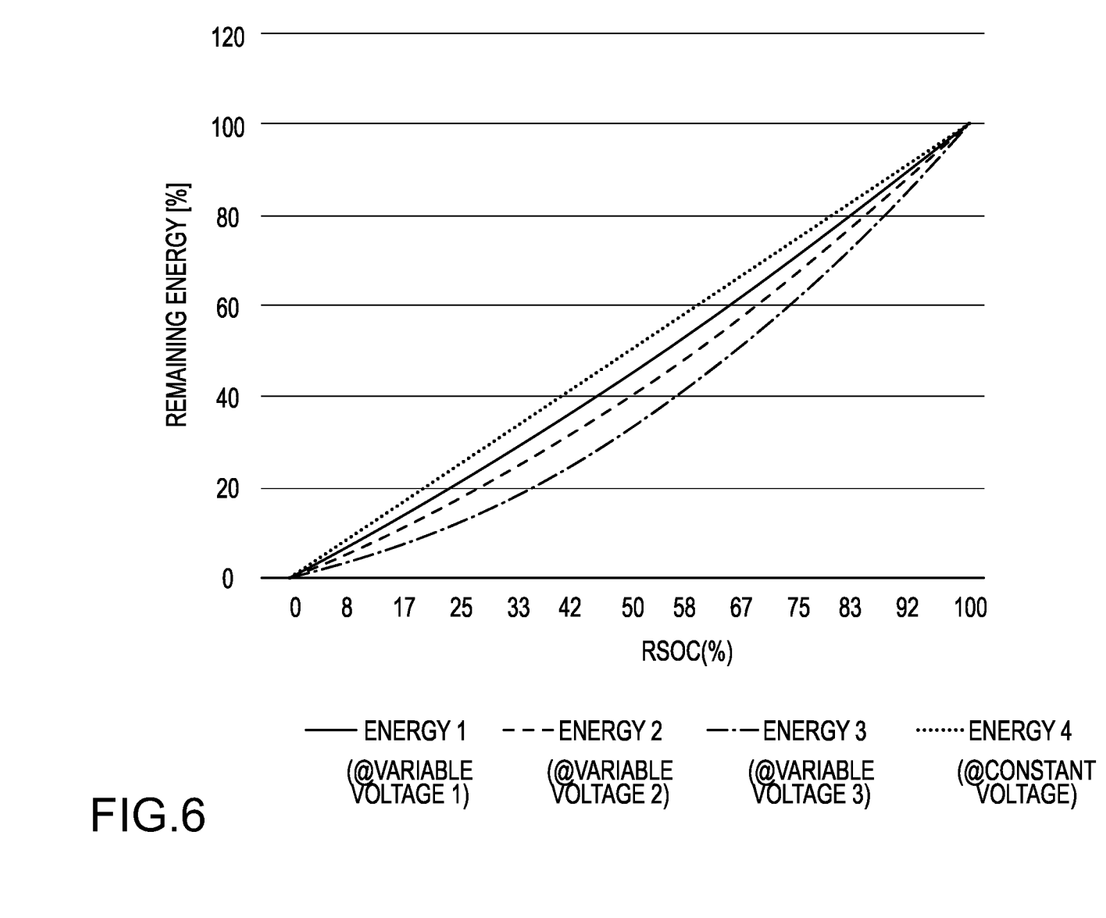
FIG. 6 is a graph illustrating remaining energy over time with various voltage conditions as a function of RSOC in accordance with an exemplary embodiment of the present technology.

In an exemplary embodiment, the fuel gauge circuit 110 may comprise a memory 140 to store the known battery characteristics and profile data of the battery 101, such as a plurality of energy curves as a function of voltage and remaining capacity (e.g., as illustrated in FIG. 6). The energy curves may be stored in a look-up table or any other data storage suitable for storing relational data.

The memory 140 may also store various previously- and currently-computed or measured variables, such as the threshold voltage $V_{TH}$, elapsed time values, measured battery voltage values, predetermined time values (such as a recovery time RT) and the like.

The memory 140 may comprise any number of storage devices, such as registers, a flash memory device, EEPROM (electrically erasable programmable read-only memory), ROM (read only memory), and RAM (random access memory), and the like.

In an exemplary embodiment, the fuel gauge circuit 110 may comprise a timer 145 to measure or otherwise count an amount of elapsed time t from a starting time. The timer 145 may comprise any circuit and/or device suitable for measuring/counting an amount of time elapsed from a starting time.

In an exemplary embodiment, the fuel gauge circuit 110 may comprise a logic circuit 150 to perform various computations and/or estimate the lifespan of the battery 101. According to an exemplary embodiment, the logic circuit 150 may be configured to determine a remaining energy of the battery 101 based on the plurality of energy curves, the remaining capacity (i.e., RSOC), and the voltage $V_B$ of the battery 101.

The logic circuit 150 may be configured to receive the computed remaining capacity (i.e., RSOC) from the calculation circuit 125. The logic circuit 150 may also be configured to access various data from the memory 140, such as data from the plurality of energy curves. In addition, the logic circuit 150 may be configured to communicate with the timer 145. For example, the logic circuit 150 may be configured to reset and restart the timer 145 and/or receive the elapsed time value t.

According to an exemplary embodiment, the logic circuit 150 may be configured to estimate the lifespan of the battery 101 based on measured parameters and/or known parameters, such as the remaining capacity (i.e., RSOC), the voltage $V_B$ of the battery 101, and the remaining energy of the battery 101.

The logic circuit 150 may comprise any number of circuits, systems, and/or logic gates to perform the desired computations, as described above. For example, the logic circuit 150 may comprise a field programmable gate array, and application specific integrated circuit, and the like.

Figure 3A:
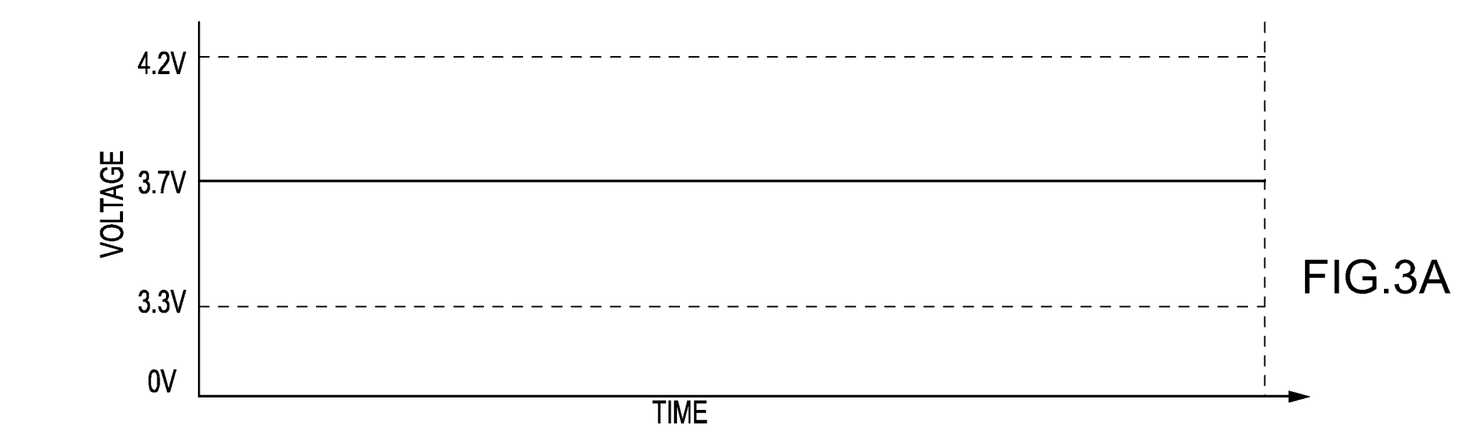
FIG. 3A is a graph illustrating a constant voltage of a discharging battery.
Figure 3B:
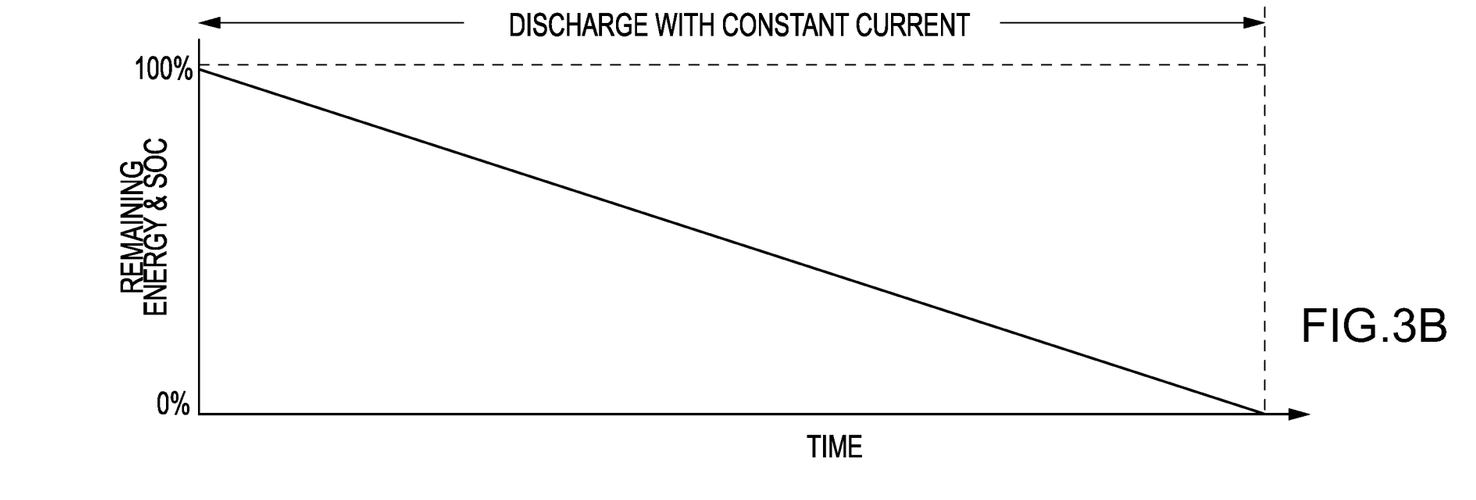
FIG. 3B is a graph illustrating remaining energy and remaining state of charge of a discharging battery with constant current and constant voltage.
Figure 4A:
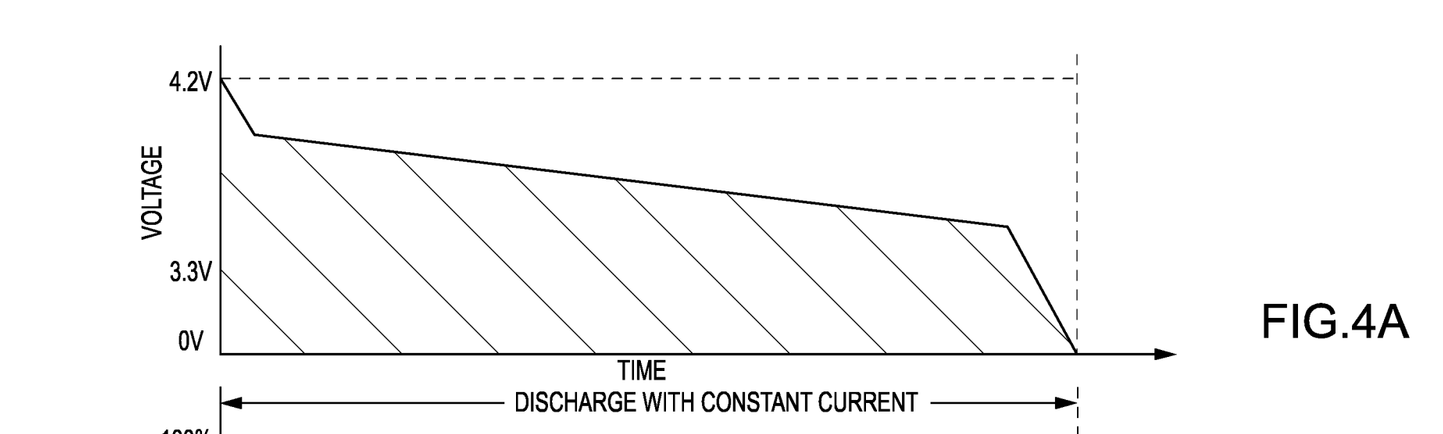
FIG. 4A is a graph illustrating a variable voltage of a discharging battery.
Figure 4B:
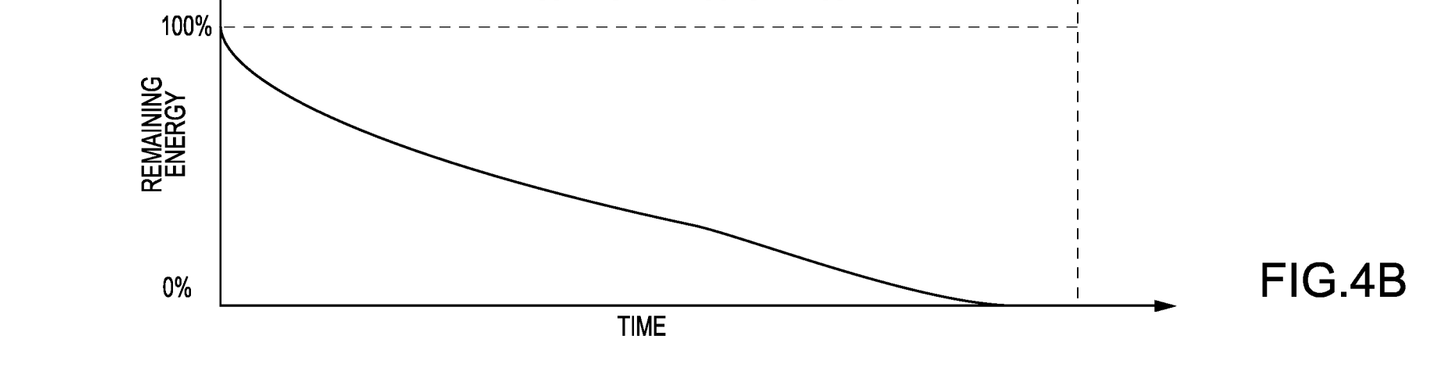
FIG. 4B is a graph illustrating remaining energy of a discharging battery with constant current and variable voltage.
Figure 5:
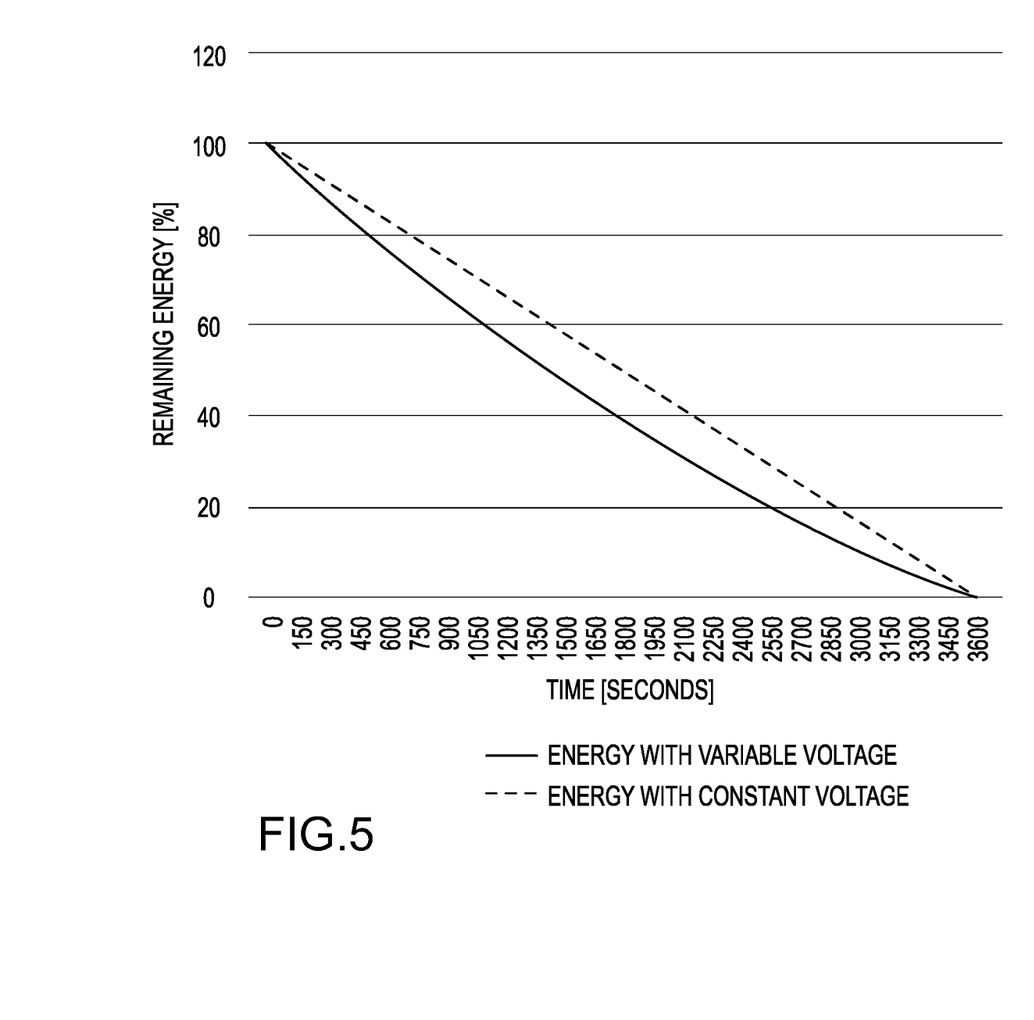
FIG. 5 is a graph illustrating remaining energy over time with variable voltage and remaining energy over time with constant voltage.

In general, and referring to FIGS. 3A-3B and 5, if the voltage of the battery 101 is constant over time (during a discharge period) and the current is also constant during that same period, the remaining energy of the battery 101 will be the same as the remaining capacity (i.e., SOC or RSOC) and both will decrease linearly over time. However, and referring to FIGS. 4A-4B, when the voltage of the battery is not constant during a discharge period, then the remaining energy of the battery 101 is not equal to the remaining capacity and does not decrease linearly. In most applications, the battery voltage is not constant during a discharge period, therefore, the remaining capacity is not equal to the remaining energy of the battery 101, and the remaining capacity may not provide an accurate estimate of the lifespan of the battery 101.

Figure 2:
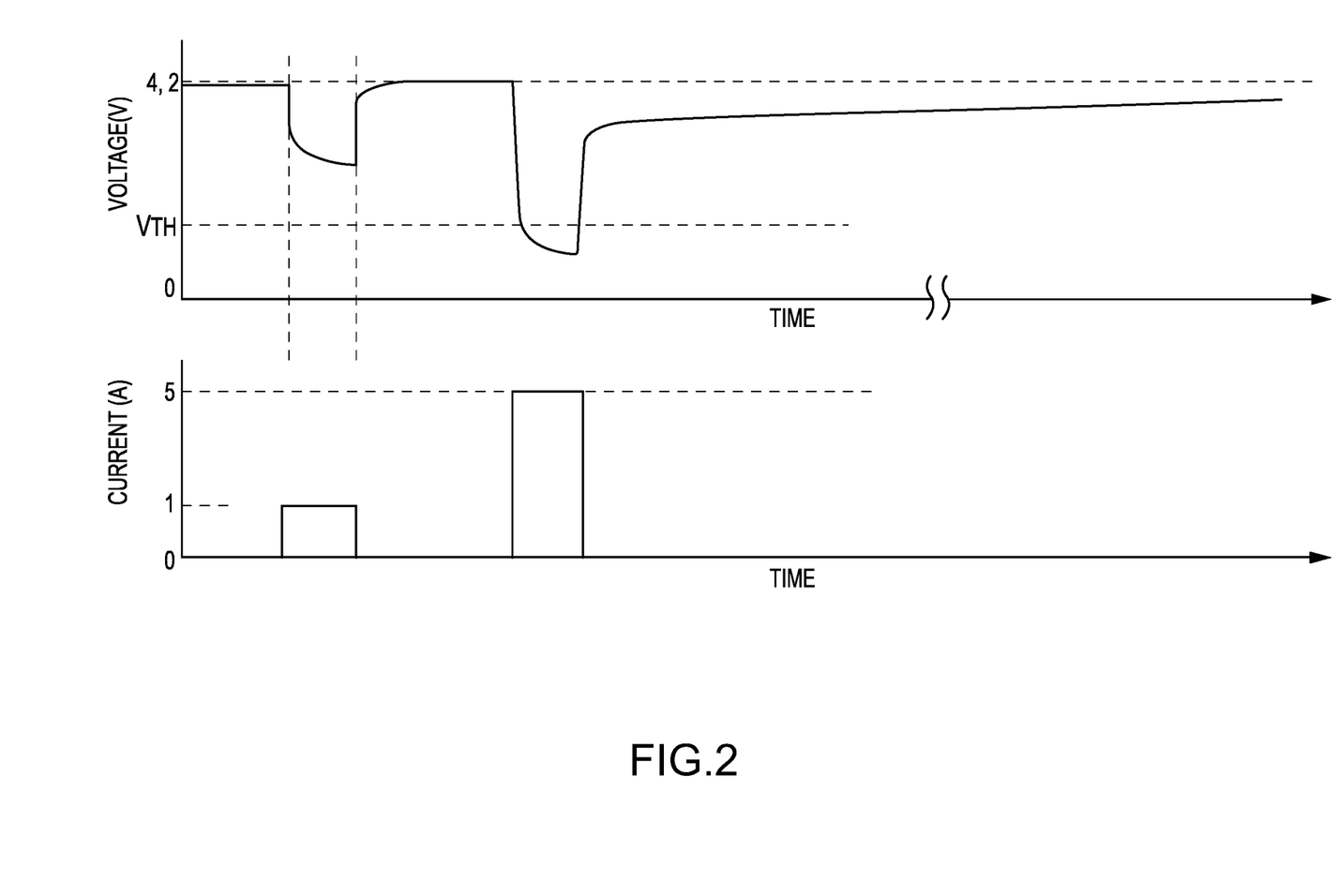
FIG. 2 illustrates voltage and current characteristics of a battery in accordance with an exemplary embodiment of the present technology.

In addition, and referring to FIG. 2, during operation, the load 160 may draw a large current from the battery 101. When this occurs, the voltage of the battery 101 drops. If the voltage drops below the threshold voltage $V_{TH}$, the voltage of the battery 101 does not return to its rated voltage right away, but instead recovers after some period of time. Therefore, the amount of power that the battery 101 is capable of providing may be less than expected.

In an exemplary operation, and referring to FIGS. 1 and 5-7, the system 100 may be set with the threshold voltage $V_{TH}$ (700). For example, the memory 140 may be used to store the threshold voltage $V_{TH}$. The value of threshold voltage $V_{TH}$ may be based on the particular characteristics of the battery 101 and/or particular application. For example, the threshold voltage $V_{TH}$ may be determined during a testing period of the battery 101 in an intended application, such as an e-cigarette.

Figure 7:
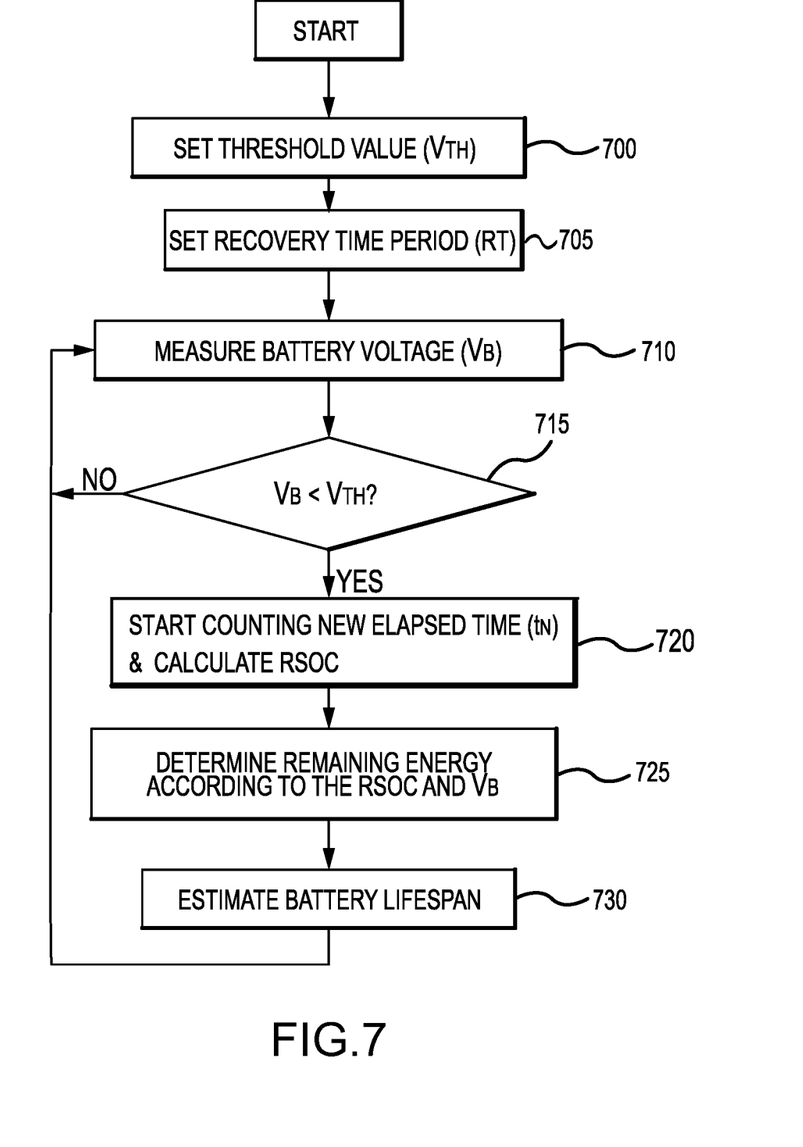
FIG. 7 is a flow chart for operating the battery system in accordance with an exemplary embodiment of the present technology.

The system 100 may then set the recovery time RT (e.g., 3600 seconds) (705). For example, the memory 140 may be used to store the recovery time RT. The value of the recovery time RT may be based on the particular characteristics of the battery 101 and/or the particular application. For example, the recovery time may be determined during a testing period of the battery 101 in an intended application, such as an e-cigarette.

The system 100 may then measure the battery voltage $V_B$ (710), for example, using the voltage sensor 130 and/or other conventional voltage measuring techniques or methods. The voltage sensor 130 may then transmit the measured voltage $V_B$ to the logic circuit 150.

The logic circuit 150 may then determine if the measured voltage $V_B$ is less than the threshold voltage $V_{TH}$. For example, the logic circuit 150 may retrieve the threshold voltage $V_{TH}$ from the memory 140 and compare it to the measured voltage $V_B$. If the measured voltage $V_B$ is not less than the threshold voltage, then the system 100 may re-measure the battery voltage $V_B$.

If the measured voltage $V_B$ is less than the threshold voltage $V_{TH}$, then the system 100 may calculate the remaining capacity (i.e., RSOC) of the battery 101 (720) for example, using the calculation circuit 125. The calculation circuit 125 may transmit the measured RSOC to the logic circuit 150.

In addition, if the measured voltage $V_B$ is less than the threshold voltage $V_{TH}$, then the logic circuit 150 may reset the timer 145 and start counting a new elapsed time $t_N$ (720).

The system 100 may then utilize the plurality of energy curves, the measured RSOC, and the battery voltage $V_B$ to determine the remaining energy of the battery 101 (725). For example, the logic circuit 150 may utilize the measured battery voltage $V_B$ to determine a particular energy curve, from the plurality of energy curves, and then use the measured RSOC to determine the remaining energy of the battery 101. For example, and referring to FIG. 6, if the battery voltage $V_B$ is within a first voltage range (variable voltage 1), the 'energy 1' curve is selected. If the measured RSOC is 50%, then based on the 'energy 1' curve, the remaining energy is approximately 45%. The system 100 may then utilize the remaining energy to estimate the lifespan of the battery 101 (730).

The system 100 may utilize the determined remaining energy to control the current from the battery 101 to the load 160, such as to conserve power and lengthen the life of the battery 101. For example, the logic circuit 150 may be configured to control (turn ON and OFF) one or more switches connected between the battery 101, the charger 105, and the load 160, which may be arranged to prevent current from flowing to the load 160 or allow current to flow to the load 160.

In addition, the system 100 may compare the new elapsed time $t_N$ to the recovery time RT. Once the elapsed time $t_N$ is equal to the recovery time RT, the system 100 may continue to use the measured remaining capacity (i.e., RSOC) to determine the lifespan of the battery 101.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for monitoring a battery, comprising:
 a voltage sensor configured to measure a voltage of the battery;
 a calculation circuit configured to measure a remaining capacity of the battery according to the measured voltage of the battery;
 a memory configured to store a predetermined voltage threshold and predetermined battery data comprising a plurality of energy curves;
 a timer configured to count to a predetermined time; and
 a logic circuit configured to:
  determine if the measured voltage of the battery is less than the predetermined voltage threshold;
  select one energy curve from the plurality of energy curves based on the measured voltage of the battery when the measured voltage of the battery is determined to be less than the predetermined voltage threshold;
  select a remaining energy value from the selected energy curve based on the measured remaining capacity; and
  reset the timer and restart the timer to count an elapsed time if the measured voltage of the battery is less than the predetermined voltage threshold.

2. The apparatus according to claim 1, wherein the logic circuit is further configured to:
 generate a modified remaining capacity value based on the measured remaining capacity and the selected energy curve.

3. The apparatus according to claim 1, wherein the battery recovers to an initial voltage at the predetermined time.

4. An apparatus for monitoring a battery, comprising:
a voltage sensor configured to measure a voltage of the battery;
a calculation circuit configured to measure a remaining capacity of the battery according to the measured voltage of the battery;
a memory configured to store a predetermined voltage threshold, and predetermined battery data comprising a plurality of energy curves;
a timer configured to count to a predetermined time;
a logic circuit configured to:
   determine if the measured voltage of the battery is less than the predetermined voltage threshold;
   select one energy curve from the plurality of energy curves based on the measured voltage of the battery when the measured voltage of the battery is determined to be less than the predetermined voltage threshold; and
   generate a modified remaining capacity value based on the measured remaining capacity and the selected energy curve.

5. The apparatus according to claim 4, wherein the logic circuit is configured to select a remaining energy value from the selected energy curve based on the measured remaining capacity.

6. An apparatus for monitoring a battery, comprising:
a voltage sensor configured to measure a voltage of the battery;
a memory configured to store a predetermined voltage threshold, predetermined battery data comprising a plurality of energy curves, and previously-measured voltage data; and
a logic circuit configured to:
   determine if the measured voltage of the battery is less than the predetermined voltage threshold;
   select one energy curve from the plurality of energy curves based on the measured voltage of the battery when the measured voltage of the battery is determined to be less than the predetermined voltage threshold; and
   estimate a lifespan of the battery based on the previously-measured voltage data and the selected energy curve.

7. The apparatus according to claim 6, further comprising a calculation circuit configured to measure a remaining capacity of the battery according to the measured voltage of the battery.

8. The apparatus according to claim 7, wherein the logic circuit is configured to select a remaining energy value from the selected energy curve based on the measured remaining capacity.

9. The apparatus according to claim 7, wherein the logic circuit is further configured to generate a modified remaining capacity value based on the measured remaining capacity and the selected energy curve.

\* \* \* \* \*